(12) United States Patent
Ichikawa

(10) Patent No.: US 11,456,244 B2
(45) Date of Patent: Sep. 27, 2022

(54) SEMICONDUCTOR DEVICE

(71) Applicant: FUJI ELECTRIC CO., LTD., Kawasaki (JP)

(72) Inventor: Hiroaki Ichikawa, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/155,687

(22) Filed: Jan. 22, 2021

(65) Prior Publication Data

US 2021/0143093 A1 May 13, 2021

Related U.S. Application Data

(63) Continuation of application No. PCT/JP2019/047746, filed on Dec. 6, 2019.

(30) Foreign Application Priority Data

Feb. 18, 2019 (JP) .............................. JP2019-026543

(51) Int. Cl.
*H01L 23/498* (2006.01)
*H01L 23/00* (2006.01)
(Continued)

(52) U.S. Cl.
CPC ........ *H01L 23/49844* (2013.01); *H01L 24/45* (2013.01); *H01L 25/072* (2013.01);
(Continued)

(58) Field of Classification Search
CPC . H01L 23/49844; H01L 24/45; H01L 25/072; H01L 25/18
See application file for complete search history.

(56) References Cited

U.S. PATENT DOCUMENTS

| 5,527,620 A | 6/1996 | Schulz-Harder |
| 2013/0001805 A1 | 1/2013 | Azuma |

(Continued)

FOREIGN PATENT DOCUMENTS

| EP | 2541596 A1 | 1/2013 |
| EP | 2590309 A1 | 5/2013 |

(Continued)

OTHER PUBLICATIONS

International Search Report for PCT/JP2019/047746, dated Feb. 10, 2020.

(Continued)

*Primary Examiner* — Marc Anthony Armand
(74) *Attorney, Agent, or Firm* — Rabin & Berdo, P.C.

(57) ABSTRACT

A semiconductor device having an arm block. The arm block includes a first circuit pattern that, in a plan view of the semiconductor device, has a recess formed thereon that extends inward from a side thereof, the recess forming a disposition area of the semiconductor device, a second circuit pattern having at least a part disposed in the disposition area, and a plurality of semiconductor chips formed on the first circuit pattern. Each semiconductor chip has a positive electrode on a back surface thereof, and a control electrode and a negative electrode on a front surface thereof, the negative electrode being electrically connected to the second circuit pattern by a wiring member.

14 Claims, 7 Drawing Sheets

(51) Int. Cl.
*H01L 25/07* (2006.01)
*H01L 25/18* (2006.01)

(52) U.S. Cl.
CPC .... *H01L 25/18* (2013.01); *H01L 2924/13055* (2013.01); *H01L 2924/13091* (2013.01)

(56) References Cited

U.S. PATENT DOCUMENTS

| | | |
|---|---|---|
| 2013/0015496 A1 | 1/2013 | Konno et al. |
| 2017/0170157 A1* | 6/2017 | Masuda ................. H01L 24/49 |
| 2017/0256483 A1 | 9/2017 | Matsuyama |
| 2018/0226324 A1 | 8/2018 | Kimura et al. |
| 2019/0279961 A1* | 9/2019 | Iwasaki ............. H01L 23/49844 |

FOREIGN PATENT DOCUMENTS

| | | |
|---|---|---|
| JP | H05-235258 A | 9/1993 |
| JP | 2010-087400 A | 4/2010 |
| JP | 2013-021107 A | 1/2013 |
| JP | 2013012560 A | 1/2013 |
| JP | 2013-098425 A | 5/2013 |
| JP | 2017-162866 A | 9/2017 |
| JP | 2018-125494 A | 8/2018 |
| WO | 2016/009496 A1 | 1/2016 |

OTHER PUBLICATIONS

Written Opinion for PCT/JP2019/047746, dated Feb. 10, 2020.
Japanese Patent Office Action dated Apr. 5, 2022 for corresponding JP Patent Application No. 2021-501589.
Waldemar Jakobi et al., "Benefits of new CoolSiCTM MOSFET in HybridPACKTM Drive package for electrical drive train applications.," CIPS 2018-10th International Conference on Integrated Power Electronics systems, Relevant Figures: 4,5, and 8, 2018.

* cited by examiner

SEMICONDUCTOR DEVICE

CROSS-REFERENCE TO RELATED APPLICATION

This application is a continuation application of International Application PCT/JP2019/047746 filed on Dec. 6, 2019 which designated the U.S., which claims priority to Japanese Patent Application No. 2019-026543, filed on Feb. 18, 2019, the entire contents of which are incorporated herein by reference.

BACKGROUND OF THE INVENTION

1. Field of the Invention

The embodiments discussed herein relate to a semiconductor device.

2. Background of the Related Art

Semiconductor devices include semiconductor elements such as an insulated gate bipolar transistor (IGBT), a power metal oxide semiconductor field effect transistor (MOSFET), a free wheeling diode (FWD), and a Schottky barrier diode (SBD). Such semiconductor devices include a plurality of semiconductor units including the above semiconductor elements and a radiation plate over which the plurality of semiconductor units are disposed. Such semiconductor devices achieve desired functions (see, for example, U.S. Pat. No. 5,527,620).

A power converter is realized by disposing, for example, IGBTs and FWDs over a substrate (see, for example, Japanese Laid-open Patent Publication No. 2018-125494). In this case, in order to effectively utilize the area of the substrate, IGBTs and FWDs which differ in chip size are disposed over a central portion of the substrate and IGBTs and FWDs are alternately disposed upward and downward from the central portion.

In order to efficiently dispose the above IGBTs and FWDs which differ in chip size in a limited area of a substrate, there is need to dispose them in block in part of the area of the substrate. This avoids useless use of an area. Furthermore, there is need to consider the optimization of the disposition of external terminals and connection wirings over the substrate. As a result, the IGBTs and FWDs are inevitably disposed over a central portion of the substrate. However, heat generated is concentrated at the central portion (one portion) of the substrate over which the IGBTs and FWDs are intensively disposed. As a result, the rated current and the like of a semiconductor device are influenced and it may be difficult to develop the characteristics of the semiconductor device.

SUMMARY OF THE INVENTION

According to an aspect, there is provided a semiconductor device having a first arm block including: a first circuit pattern that, in a plan view of the semiconductor device, has a recess formed thereon that extends inward in a first direction from a side thereof, the recess forming a first disposition area; a second circuit pattern having at least a part disposed in the first disposition area; and a plurality of first semiconductor chips formed on the first circuit pattern, each first semiconductor chip having a first positive electrode on a back surface thereof, and a first control electrode and a first negative electrode on a front surface thereof, the first negative electrode being electrically connected to the second circuit pattern by a first wiring member.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1:
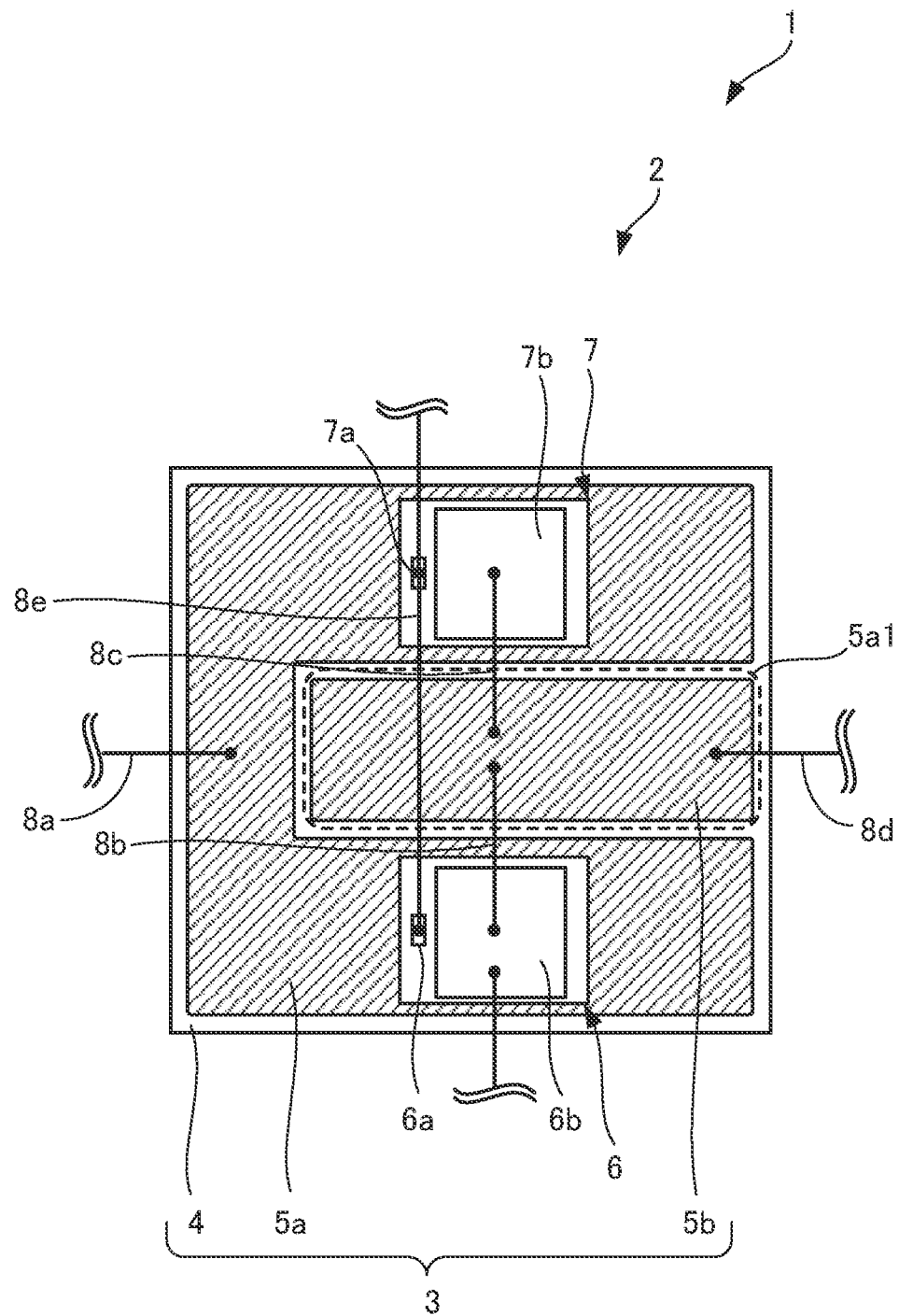
FIG. 1 is a view for describing an arm block included in a semiconductor device according to a first embodiment.

An arm block included in a semiconductor device according to a first embodiment will now be described by the use of FIG. 1. FIG. 1 is a view for describing an arm block included in a semiconductor device according to a first embodiment. A semiconductor device 1 according to a first embodiment includes an arm block 2 illustrated in FIG. 1. The arm block 2 includes a laminated substrate 3 and first semiconductor chips 6 and disposed over the laminated substrate 3. The first semiconductor chip 6 has a first positive electrode (not illustrated) on the back surface and has a first negative electrode 6b and a first control electrode 6a on the front surface. The first semiconductor chip 7 has a first positive electrode (not illustrated) on the back surface and has a first negative electrode 7b and a first control electrode 7a on the front surface. The first semiconductor chips 6 and 7 may be, for example, power MOSFETs or reverse-conducting (RC)-IGBTs. With the RC-IGBTs an IGBT and an FWD are included in one chip.

Furthermore, the laminated substrate 3 includes a substrate 4 and a first circuit pattern 5a and a second circuit pattern 5b formed over the front surface of the substrate 4. The first circuit pattern 5a has a recess in plan view. The first positive electrodes formed on the back surfaces of the first semiconductor chips 6 and 7 are disposed on the first circuit pattern 5a. That is to say, the first circuit pattern 5a is U-shaped in plan view. More specifically, the recess in the first circuit pattern 5a extends from the right side, middle of the first circuit pattern 5a in a first direction (to the left side) as viewed in FIG. 1. The first direction is directed from the side of the first circuit pattern 5a facing the right side of the substrate 4, as viewed in FIG. 1, toward the center of the first circuit pattern 5a and is perpendicular to the side of the first circuit pattern 5a. There is a first disposition area 5a1 in the recess inside the first circuit pattern 5a. The first disposition area 5a1 is indicated by a dashed line in FIG. 1. Accordingly, the first semiconductor chips 6 and 7 are disposed over the first circuit pattern 5a with the first disposition area 5a1 therebetween.

At least part of the second circuit pattern 5b is disposed in the first disposition area 5a1 and at least part of the second circuit pattern 5b is surrounded by the first circuit pattern 5a. Furthermore, the second circuit pattern 5b is connected to one end portion of each of first wiring members 8b and 8c in the first disposition area 5a1. The other end portions of the first wiring members 8b and 8c are connected to the first negative electrodes 6b and 7b of the first semiconductor chips 6 and 7 respectively. As a result, the second circuit pattern 5b is electrically connected to the first negative electrodes 6b and 7b by the first wiring members 8b and 8c to which the second circuit pattern 5b is connected in the first disposition area 5a1. The first circuit pattern 5a and the second circuit pattern 5b are conductive members. In addition, the wiring members 8b and 8c (and wiring members 8a, 8d, and 8e described later) are bonding wires, a lead frame, ribbon-shaped conductive members, or the like.

For example, a current flowing from the wiring member 8a into the above arm block 2 of the semiconductor device 1 branches off in the two directions of the first semiconductor chips 6 and 7 and flows through the first circuit pattern 5a. A current flowing through the first circuit pattern 5a flows into the first positive electrodes on the back surfaces of the first semiconductor chips 6 and 7 and output currents are outputted from the first negative electrodes 6b and 7b on the front surfaces of the first semiconductor chips 6 and 7 respectively. The output currents outputted from the first semiconductor chips 6 and 7 flow into the second circuit pattern 5b via the wiring members 8b and 8c. At this time a control signal is inputted via the wiring member 8e to the first control electrodes 6a and 7a of the first semiconductor chips 6 and 7, respectively, at a determined timing. The output currents flowing into the second circuit pattern 5b are outputted in this way to the outside of the arm block 2 by the wiring member 8d.

At this time the first semiconductor chips 6 and 7 in the arm block 2 of the semiconductor device 1 which output the currents generate heat as a result of driving. However, the first circuit pattern 5a has the recess in plan view and the second circuit pattern 5b is disposed in the recess of the first circuit pattern 5a. Accordingly, the first circuit pattern 5a is disposed on an outer peripheral portion of the laminated substrate 3 and the second circuit pattern 5b is disposed on a central portion of the laminated substrate 3. The first semiconductor chips 6 and 7 disposed over the first circuit pattern 5a are not disposed on the central portion of the laminated substrate 3 and are situated on the outer peripheral portion of the laminated substrate 3. This suppresses heat concentration at one portion of the laminated substrate 3. That is to say, heat is dispersed and a heat dissipation property is improved. Furthermore, the output currents outputted from the first semiconductor chips 6 and 7 are collected on the second circuit pattern 5b disposed on the central portion of the laminated substrate 3. Accordingly, control voltages applied to the first control electrodes 6a and 7a of the first semiconductor chips 6 and 7, respectively, become equal and the first semiconductor chips 6 and 7 are driven in a well-balanced way. This suppresses deterioration in the characteristics of the semiconductor device 1 including the above arm block 2.

Second Embodiment

Figure 2A:
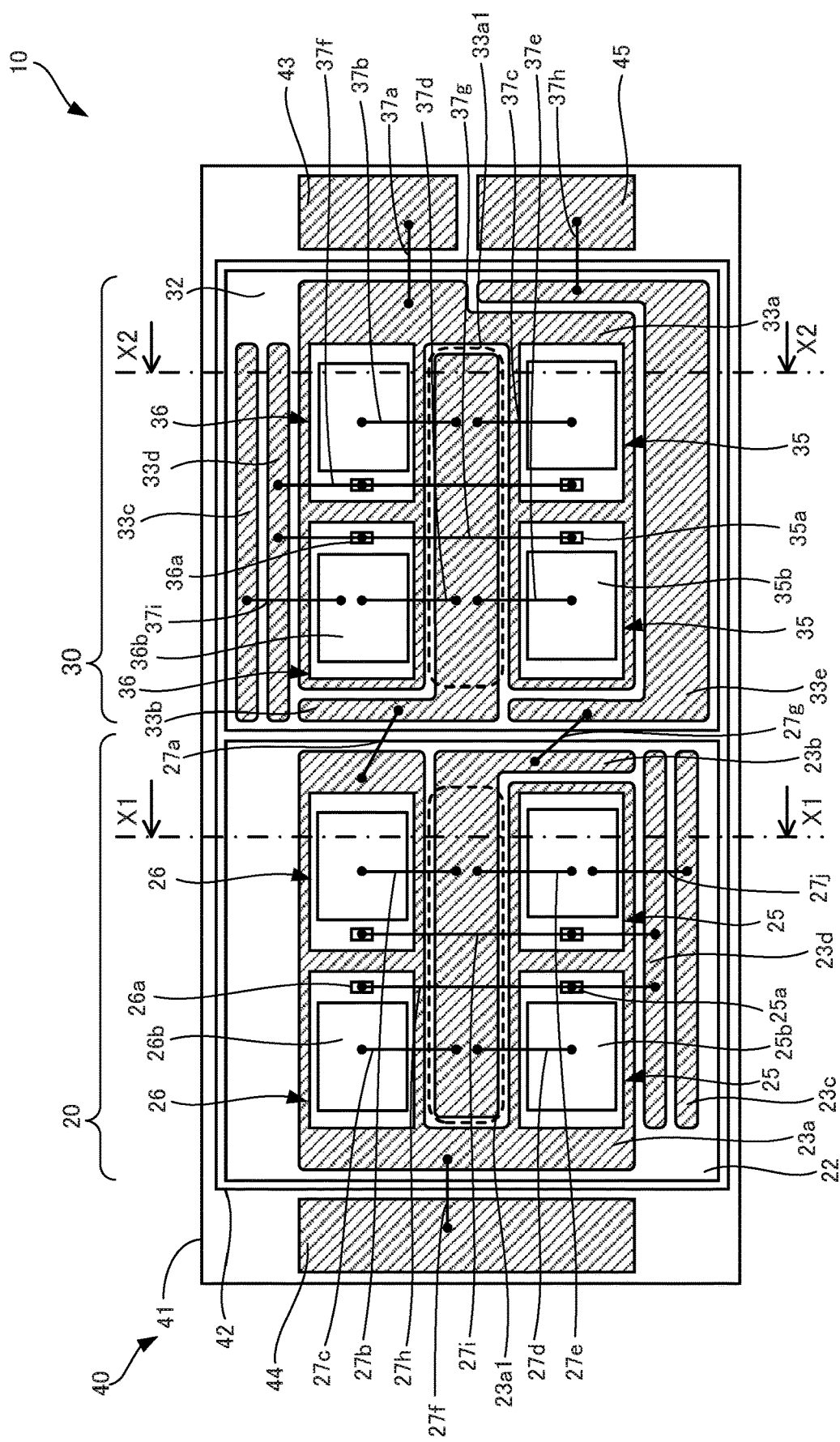
FIGS. 2A and 2B are plan views of a semiconductor device according to a second embodiment.
Figure 2B:
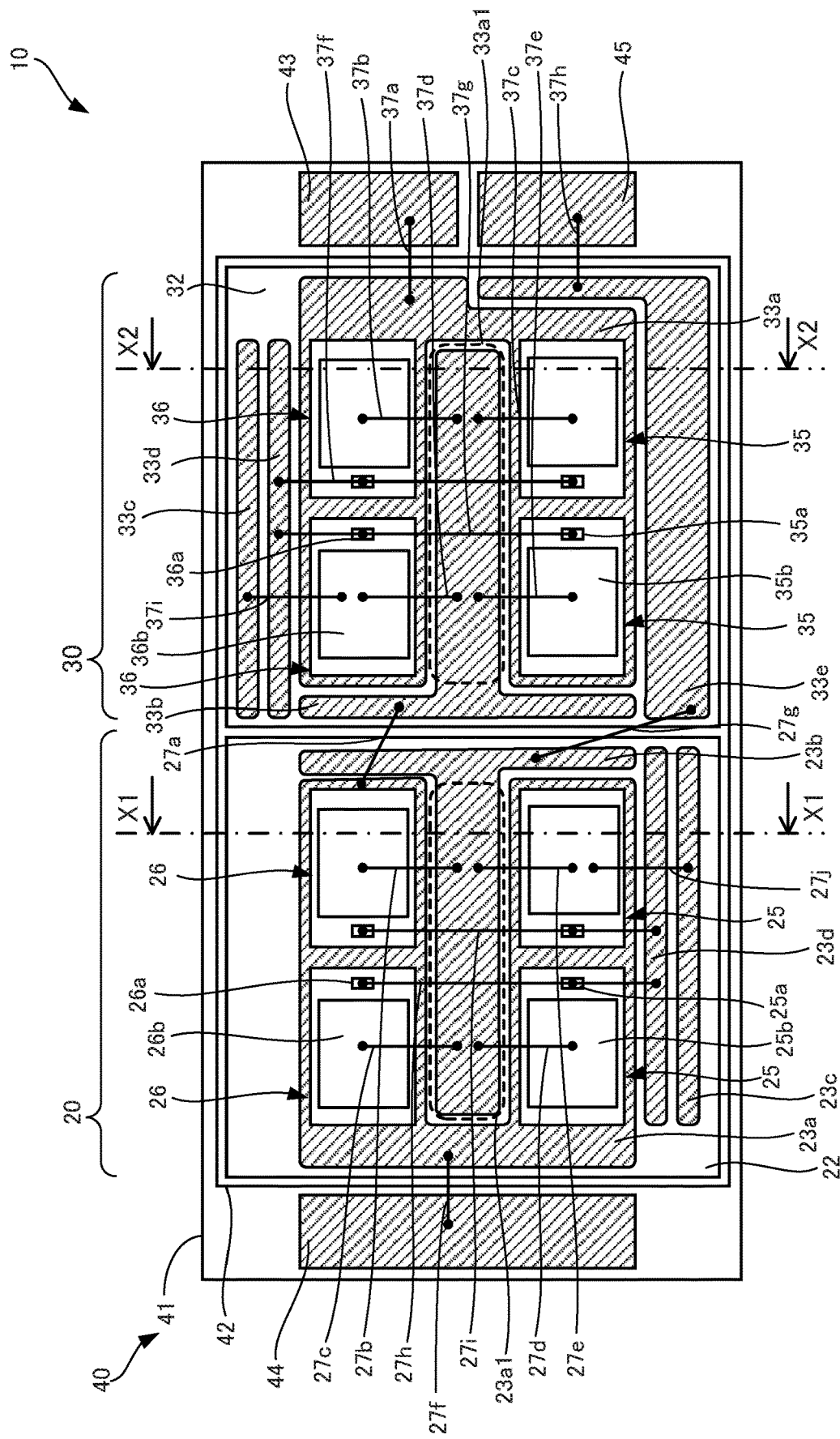
Figure 3A:
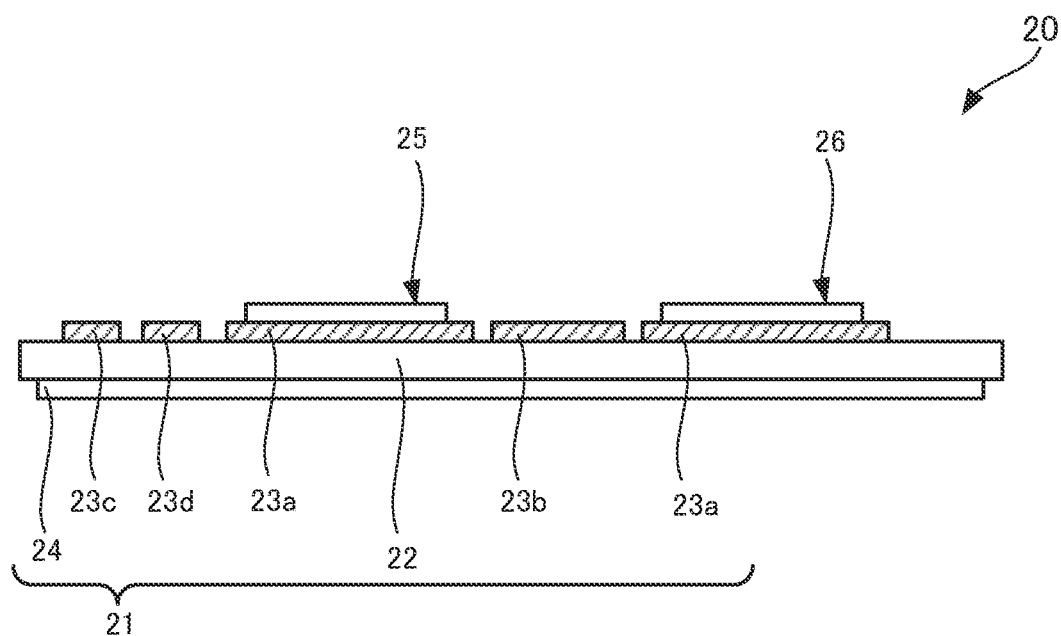
FIGS. 3A and 3B are sectional views of the semiconductor device according to the second embodiment.
Figure 3B:
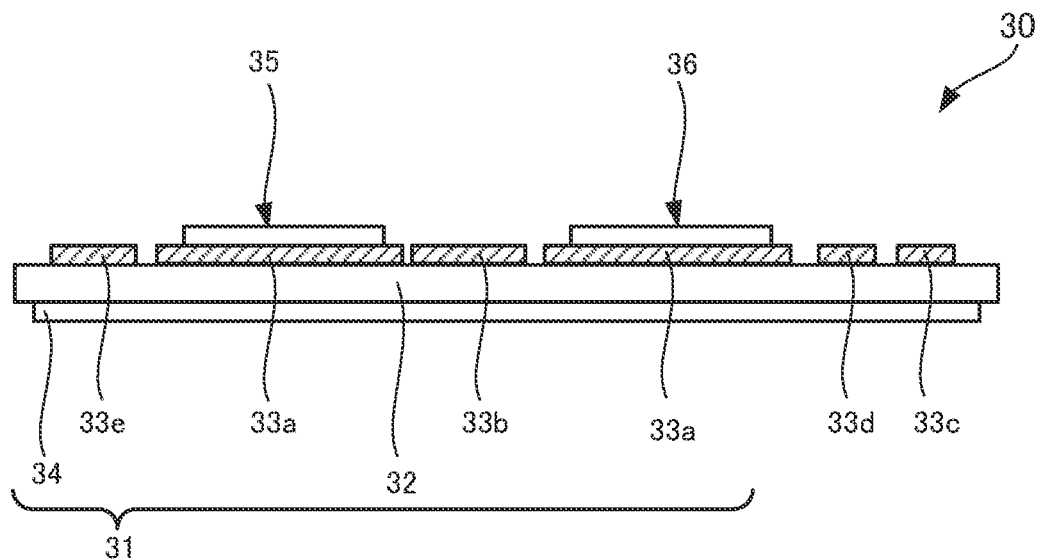

A semiconductor device of a second embodiment will be described. First a semiconductor device will be described by the use of FIGS. 2A, 2B, 3A and 3B. FIGS. 2A and 2B are plan views of a semiconductor device according to a second embodiment. FIGS. 3A and 3B are sectional views of the semiconductor device according to the second embodiment. FIG. 2A illustrates the case where circuit patterns 23b and 33b are formed in an L shape, and FIG. 2B illustrates the case where the circuit patterns 23b and 33b are formed in a T shape. Except for the circuit patterns 23b and 33b, the semiconductor device 10 illustrated in FIG. 2A has the same configuration as the semiconductor device 10 illustrated in FIG. 2B. FIG. 3A is a sectional view taken along the dot-dash line X1-X1 of FIG. 2A. FIG. 3B is a sectional view taken along the dot-dash line X2-X2 of FIG. 2A.

A semiconductor device 10 includes a first arm block 20 and a second arm block 30. With the semiconductor device 10 an upper arm block and a lower arm block are formed of the first arm block 20 and the second arm block 30. The first arm block 20 and the second arm block 30 are electrically connected by bonding wires 27a and 27g. Furthermore, the semiconductor device 10 includes a radiation board (not illustrated) and a case 40. The first arm block 20 and the second arm block 30 are disposed over the radiation board with solder (not illustrated) therebetween. The case 40 is disposed over the radiation board and encloses the first arm block 20 and the second arm block 30. Furthermore, the case 40 and the first arm block 20 and the second arm block 30 are electrically connected by bonding wires 27f, 37a, and 37h. In this embodiment the number of bonding wires used for electrically connecting components is only one for the sake of simplicity. In reality, however, more than one bonding wire may be used for electrically connecting components. In addition, a wiring member, such as a plate-shaped lead frame or a ribbon in the shape of a thin strap, may be used in place of a bonding wire.

The first arm block 20 includes a ceramic circuit board 21 and semiconductor chips 25 and 26 located over the front surface of the ceramic circuit board 21. Furthermore, the ceramic circuit board 21 is disposed over the radiation board with solder, silver solder, or the like (not illustrated) therebetween.

The semiconductor chips 25 and 26 (first semiconductor chips) are made of silicon. Each of these semiconductor chips 25 and 26 includes an RC-IGBT which is a switching element. With the RC-IGBT an IGBT and an FWD are included in one chip. An RC-IGBT chip includes a circuit in which an IGBT and an FWD are connected in inverse parallel. Furthermore, the semiconductor chips 25 and 26 are made of silicon carbide. Each of these semiconductor chips 25 and 26 includes a MOSFET which is a switching element. With the MOSFET a body diode is equivalently incorporated. For example, the semiconductor chip 25 has a collector electrode (positive electrode or a drain electrode in the case of a MOSFET) as a main electrode on the back surface and has a gate electrode 25a (control electrode) and an emitter electrode 25b (negative electrode or a source electrode in the case of a MOSFET)) as a main electrode on the front surface. The semiconductor chip 26 has a collector electrode (positive electrode or a drain electrode in the case of a MOSFET) as a main electrode on the back surface and has a gate electrode 26a (control electrode) and an emitter electrode 26b (negative electrode or a source electrode in the case of a MOSFET)) as a main electrode on the front surface. Furthermore, with the semiconductor chip 25 the gate electrode 25a is located in the center of an edge portion of the front surface and the emitter electrode 25b is located in a central portion of the front surface. With the semiconductor chip 26 the gate electrode 26a is located in the center of an edge portion of the front surface and the emitter electrode 26b is located in a central portion of the front surface. The collector electrodes on the back surfaces of the semiconductor chips 25 and 26 are not illustrated. The semiconductor device 10 uses a switching element which is an RC-IGBT or a MOSFET made of silicon carbide. As a result, there is no need to connect a diode element in parallel with it. Accordingly, a switching element which is an RC-IGBT or a MOSFET made of silicon carbide is suitable for disposing over U-shaped circuit patterns 23a and 33a described later.

The ceramic circuit board 21 includes an insulating board 22 and a metal plate 24 formed on the back surface of the insulating board 22. Furthermore, the ceramic circuit board 21 includes circuit patterns 23a through 23d formed over the front surface of the insulating board 22. The insulating board 22 is made of a ceramic, such as aluminum oxide, aluminum nitride, or silicon nitride, having high thermal conductivity. The metal plate 24 is made of metal, such as aluminum, iron, silver, copper, or an alloy containing at least one of them, having high thermal conductivity. The circuit patterns 23a through 23d are made of metal, such as copper or a copper alloy, having good electrical conductivity. Furthermore, in order to improve corrosion resistance, a material, such as nickel, may be formed on the surfaces of the circuit patterns 23a through 23d by plating treatment or the like. To be concrete, a nickel-phosphorus alloy, a nickel-boron alloy, or the like may be used in place of nickel. In addition, the thickness of the circuit patterns 23a through 23d is, for example, greater than or equal to 0.1 mm and smaller than or equal to 1 mm. A direct copper bonding (DCB) substrate, an active metal brazed (AMB) substrate, or the like may be used as the ceramic circuit board 21 having the above structure. The ceramic circuit board 21 transfers heat generated by the semiconductor chips 25 and 26 to the radiation board via the circuit pattern 23a, the insulating board 22, and the metal plate 24. The ceramic circuit board 21 is an example. A lead frame on which a metal base substrate and a die pad are formed may be used.

The circuit pattern 23a (first circuit pattern) is a collector pattern of the first arm block 20. The collector electrodes formed on the back surfaces of the semiconductor chips 25 and 26 are bonded to the circuit pattern 23a with solder therebetween. The circuit pattern 23a has a recess in plan view. There is a disposition area 23a1 (first disposition area) in the recess inside the circuit pattern 23a. The disposition area 23a1 is indicated by a dashed line in FIG. 2A. The circuit pattern 23a may be U-shaped in plan view. The semiconductor chips 25 and 26 are arranged in line along the disposition area 23a1 over the circuit pattern 23a with the disposition area 23a1 therebetween. The semiconductor chips 25 and 26 are disposed so that the gate electrodes 25a and 26a will be in line. Furthermore, the gate electrodes 25a are opposite each other and the gate electrodes 26a are opposite each other. The number of semiconductor chips 25 and 26 may be three or more.

The circuit pattern 23b (second circuit pattern) is an emitter pattern of the first arm block 20. The circuit pattern 23b has the disposition area 23a1. The disposition area 23a1 is connected to the emitter electrodes 25b and 26b of the semiconductor chips 25 and 26 by bonding wires 27d, 27e, 27b and 27c. In FIG. 2A, the circuit pattern 23b is L-shaped in plan view. That is to say, the circuit pattern 23b has a first part and a second part. The first part is disposed in the disposition area 23a1. The second part extends outside the disposition area 23a1 from an end portion of the first part perpendicularly (downward in FIG. 2A) to the direction in which the disposition area 23a1 extends. As illustrated in FIG. 2B, the circuit pattern 23b may be T-shaped in plan view. That is to say, the second part of the circuit pattern 23b may extend outside the disposition area 23a1 from the end portion of the first part perpendicularly (upward and downward in FIG. 2A) to the direction in which the disposition area 23a1 extends.

The circuit patterns 23c and 23d are a sense emitter pattern and a gate pattern, respectively, of the first arm block 20. The circuit pattern 23a is between the circuit patterns 23c and 23d (fifth circuit patterns) and the disposition area 23a1 and the circuit patterns 23c and 23d are disposed adjacently to the circuit pattern 23a. That is to say, the circuit patterns 23c and 23d are disposed adjacently to the circuit pattern 23a in parallel to sides of the circuit pattern 23a that are apart from each other in a direction perpendicular to the opening direction of a recessed opening of the circuit pattern 23a in plan view. Furthermore, the circuit patterns 23c and 23d are disposed adjacently to the circuit pattern 23a parallel to two sides of the disposition area 23a1 opposite each other. In FIG. 2A, the circuit patterns 23c and 23d are disposed under the circuit pattern 23a. However, the circuit patterns 23c and 23d may be disposed at need over the circuit pattern 23a in FIG. 2A. In addition, in order to save space, the circuit patterns 23c and 23d formed along a side of the insulating board 22 are made long and narrow. The circuit pattern 23c is connected to the emitter electrode 25b of the semiconductor chip 25 by a bonding wire 27j. The circuit pattern 23d is connected to the gate electrodes 25a and 26a of the semiconductor chips 25 and 26, respectively, by bonding wires 27h and 27i.

The second arm block 30 includes a ceramic circuit board 31 and semiconductor chips 35 and 36 located over the front surface of the ceramic circuit board 31. Furthermore, the ceramic circuit board 31 is disposed over the radiation board with solder, silver solder, or the like (not illustrated) therebetween. Components of the second arm block 30 are disposed so that the components of the second arm block 30 and the components of the first arm block 20 will be approximately symmetrical in plan view with respect to the center point of the semiconductor device 10.

The semiconductor chips 35 and 36 (second semiconductor chips) are made of silicon. This is the same with the semiconductor chips 25 and 26. Each of the semiconductor chips 35 and 36 also includes an RC-IGBT which is a switching element. With the RC-IGBT an IGBT and an FWD are included in one chip. Furthermore, the semiconductor chips 35 and 36 are made of silicon carbide. Each of the semiconductor chips 35 and 36 also includes a MOSFET which is a switching element. As a result, the semiconductor chip 35 has a collector electrode (positive electrode or a drain electrode in the case of a MOSFET) as a main electrode on the back surface and has a gate electrode 35a (control electrode) and an emitter electrode 35b (negative electrode or a source electrode in the case of a MOSFET)) as a main electrode on the front surface. The semiconductor chip 36 has a collector electrode (positive electrode or a drain electrode in the case of a MOSFET) as a main electrode on the back surface and has a gate electrode 36a (control electrode) and an emitter electrode 36b (negative electrode or a source electrode in the case of a MOSFET)) as a main electrode on the front surface. Furthermore, with the semiconductor chip 35 the gate electrode 35a is located in the center of an edge portion of the front surface and the emitter electrode 35b is located in a central portion of the front surface. With the semiconductor chip 36 the gate electrode 36a is located in the center of an edge portion of the front surface and the emitter electrode 36b is located in a central portion of the front surface. The collector electrodes on the back surfaces of the semiconductor chips 35 and 36 are not illustrated.

The ceramic circuit board 31 includes an insulating board 32 and a metal plate 34 formed on the back surface of the insulating board 32. Furthermore, the ceramic circuit board 31 includes the circuit patterns 33a through 33e formed over the front surface of the insulating board 32. The insulating board 32 is made of a ceramic, such as aluminum oxide, aluminum nitride, or silicon nitride, having high thermal conductivity. The metal plate 34 is made of metal, such as aluminum, iron, silver, copper, or an alloy containing at least one of them, having high thermal conductivity. The circuit patterns 33a through 33e are made of metal, such as copper or a copper alloy, having good electrical conductivity. Furthermore, in order to improve corrosion resistance, a material, such as nickel, may be formed on the surfaces of the circuit patterns 33a through 33e by plating treatment or the like. To be concrete, a nickel-phosphorus alloy, a nickel-boron alloy, or the like may be used in place of nickel. In addition, the thickness of the circuit patterns 33a through 33e is, for example, greater than or equal to 0.1 mm and smaller than or equal to 1 mm. A DCB substrate, an AMB substrate, or the like may be used as the ceramic circuit board 31 having the above structure. The ceramic circuit board 31 transfers heat generated by the semiconductor chips 35 and 36 to the radiation board via the circuit pattern 33a, the insulating board 32, and the metal plate 34. The ceramic circuit board 31 is an example. A lead frame on which a metal base substrate and a die pad are formed may be used.

The circuit pattern 33a (third circuit pattern) is a collector pattern of the second arm block 30. The collector electrodes formed on the back surfaces of the semiconductor chips 35 and 36 are bonded to the circuit pattern 33a with solder therebetween. The circuit pattern 33a has a recess in plan view. There is a disposition area 33a1 (second disposition area) in the recess inside the circuit pattern 33a. The disposition area 33a1 is indicated by a dashed line in FIG. 2A. Furthermore, the disposition area 33a1 of the circuit pattern 33a is opposed to the disposition area 23a1 of the circuit pattern 23a and the circuit pattern 33a is adjacent to the circuit pattern 23a. That is to say, the circuit pattern 33a of the second arm block 30 is adjacent to the circuit pattern 23a of the first arm block 20 in a state in which the recess of the circuit pattern 33a is opposite the recess of the circuit pattern 23a. The semiconductor chips 35 and 36 are arranged in line over the circuit pattern 33a with the disposition area 33a1 therebetween. The semiconductor chips 35 and 36 are disposed so that the gate electrodes 35a and 36a will be in line. Furthermore, the gate electrodes 35a are opposite each other and the gate electrodes 36a are opposite each other. The number of semiconductor chips 35 and 36 may be three or more.

The circuit pattern 33b (fourth circuit pattern) is an emitter pattern of the second arm block 30. The circuit pattern 33b has the disposition area 33a1. The disposition area 33a1 is connected to the emitter electrodes 35b and 36b of the semiconductor chips 35 and 36 by bonding wires 37c, 37e, 37b, and 37d. In FIG. 2A, the circuit pattern 33b is L-shaped in plan view. That is to say, the circuit pattern 33b includes an area disposed in the whole of the disposition area 33a1 and an area perpendicular to the above area and extending upward in FIG. 2A. The circuit pattern 33b is electrically connected to the circuit pattern 23a by the bonding wire 27a. In FIG. 2A, the circuit pattern 33b is L-shaped in plan view. That is to say, the circuit pattern 33b has a third part and a fourth part. The third part is disposed in the disposition area 33a1. The fourth part extends outside the disposition area 33a1 from an end portion of the third part perpendicularly to the direction in which the disposition area 33a1 extends and in the direction opposite to the direction in which the second part of the circuit pattern 23b extends downward in FIG. 2A. As illustrated in FIG. 2B, the circuit pattern 33b may be T-shaped in plan view. That is to say, the fourth part of the circuit pattern 33b may extend outside the disposition area 33a1 from the end portion of the third part perpendicularly (upward and downward in FIG. 2A) to the direction in which the disposition area 33a1 extends.

The circuit patterns 33c and 33d are a sense emitter pattern and a gate pattern, respectively, of the second arm block 30. The circuit pattern 33a is between the circuit patterns 33c and 33d (sixth circuit patterns) and the disposition area 33a1 and the circuit patterns 33c and 33d are disposed adjacently to the circuit pattern 33a. Furthermore, the circuit patterns 33c and 33d and the circuit patterns 23c and 23d, respectively, are symmetrical with respect to the center point of the semiconductor device 10. In this case, the circuit patterns 33c and 33d are disposed over the circuit pattern 33a in FIG. 2A. However, the circuit patterns 33c and 33d may be disposed under the circuit pattern 33a in FIG. 2A, depending on the positions of the circuit patterns 23c and 23d. In addition, in order to save space, the circuit patterns 33c and 33d formed along a side of the insulating board 32 are made long and narrow. The circuit pattern 33c is connected to the emitter electrode 36b of the semiconductor chip 36 by a bonding wire 37i. The circuit pattern 33d is connected to the gate electrodes 35a and 36a of the semiconductor chips 35 and 36, respectively, by bonding wires 37f and 37g. The circuit pattern 33e is disposed adjacently to the circuit pattern 33a (under the circuit pattern 33a in FIG. 2A) on the opposite side of the disposition area 33a1 of the circuit pattern 33a. Moreover, the circuit pattern 33e is electrically connected to the circuit pattern 23b by the bonding wire 27g.

As stated above, the case 40 is disposed over the radiation board and includes an enclosure 41 which is rectangular in plan view. The enclosure 41 of the case 40 has the shape of a box which surrounds all sides. A storage area 42 in which the above first arm block 20 and second arm block 30 are housed is formed in the enclosure 41. Furthermore, external terminal portions 43 through 45 are formed on the left and right edges of the enclosure 41 in FIG. 2A. The external terminal portion 43 is electrically connected to the circuit pattern 33a of the second arm block 30 housed in the enclosure 41 by the bonding wire 37a. The external terminal portion 44 is electrically connected to the circuit pattern 23a of the first arm block 20 housed in the enclosure 41 by the bonding wire 27f. The external terminal portion 45 is electrically connected to the circuit pattern 33e of the second arm block 30 housed in the enclosure 41 by the bonding wire 37h. Accordingly, a positive electrode is connected to the external terminal portion 43, a negative electrode is connected to the external terminal portion 45, and an output is obtained from the external terminal portion 44. The case 40 includes a control terminal (not illustrated) from which a control signal is inputted to both edge portions in the longitudinal direction of the enclosure 41. The control terminal is electrically connected to the circuit patterns 23c and 33c. For example, the above case 40 includes the external terminal portions 43 through 45 and is formed by injection molding by the use of a thermoplastic resin.

Polyphenylene sulfide (PPS), polybutylene terephthalate (PBT) resin, polybutylene succinate (PBS) resin, polyamide (PA) resin, acrylonitrile butadiene styrene (ABS) resin, or the like is used as such a thermoplastic resin.

The above bonding wires 27a through 27j and 37a through 37i are made of metal, such as aluminum or copper, an alloy containing at least one of them, or the like having good electrical conductivity. Furthermore, it is desirable that the diameter of the bonding wires 27a through 27j and 37a through 37i be greater than or equal to 100 µm and smaller than or equal to 1 mm. In addition, the radiation board (not illustrated) is made of aluminum, iron, silver, copper, an alloy containing at least one of them, or the like having high thermal conductivity. Moreover, in order to improve corrosion resistance, a material, such as nickel, may be formed on the surface of the radiation board by plating treatment or the like. To be concrete, a nickel-phosphorus alloy, a nickel-boron alloy, or the like may be used in place of nickel. Fixing holes used for fixing the radiation board to an external device, a contact area used for inputting a current to or outputting current from the first arm block 20 and second arm block 30, or the like is properly formed in the radiation board.

Furthermore, a cooler (not illustrated) may be fixed to the back surface of the radiation board of the above semiconductor device 10. At this time the cooler is fixed to the back surface of the radiation board with thermal grease, such as silicone to which a metal oxide filler is added, therebetween. This improves the heat dissipation property of the semiconductor device 10. In this case, the cooler is made of aluminum, iron, silver, copper, or an alloy containing at least one of them, or the like having high thermal conductivity. Moreover, a fin, a heat sink made up of a plurality of fins, a water-cooling cooler, or the like may be used as the cooler. Furthermore, the radiation board and the cooler may be integrally formed. In that case, the radiation board and the cooler are made of aluminum, iron, silver, copper, or an alloy containing at least one of them having high thermal conductivity. In addition, in order to improve corrosion resistance, a material, such as nickel, may be formed on the surface of the radiation board integrally formed with the cooler by plating treatment or the like. To be concrete, a nickel-phosphorus alloy, a nickel-boron alloy, or the like may be used in place of nickel.

Figure 4:
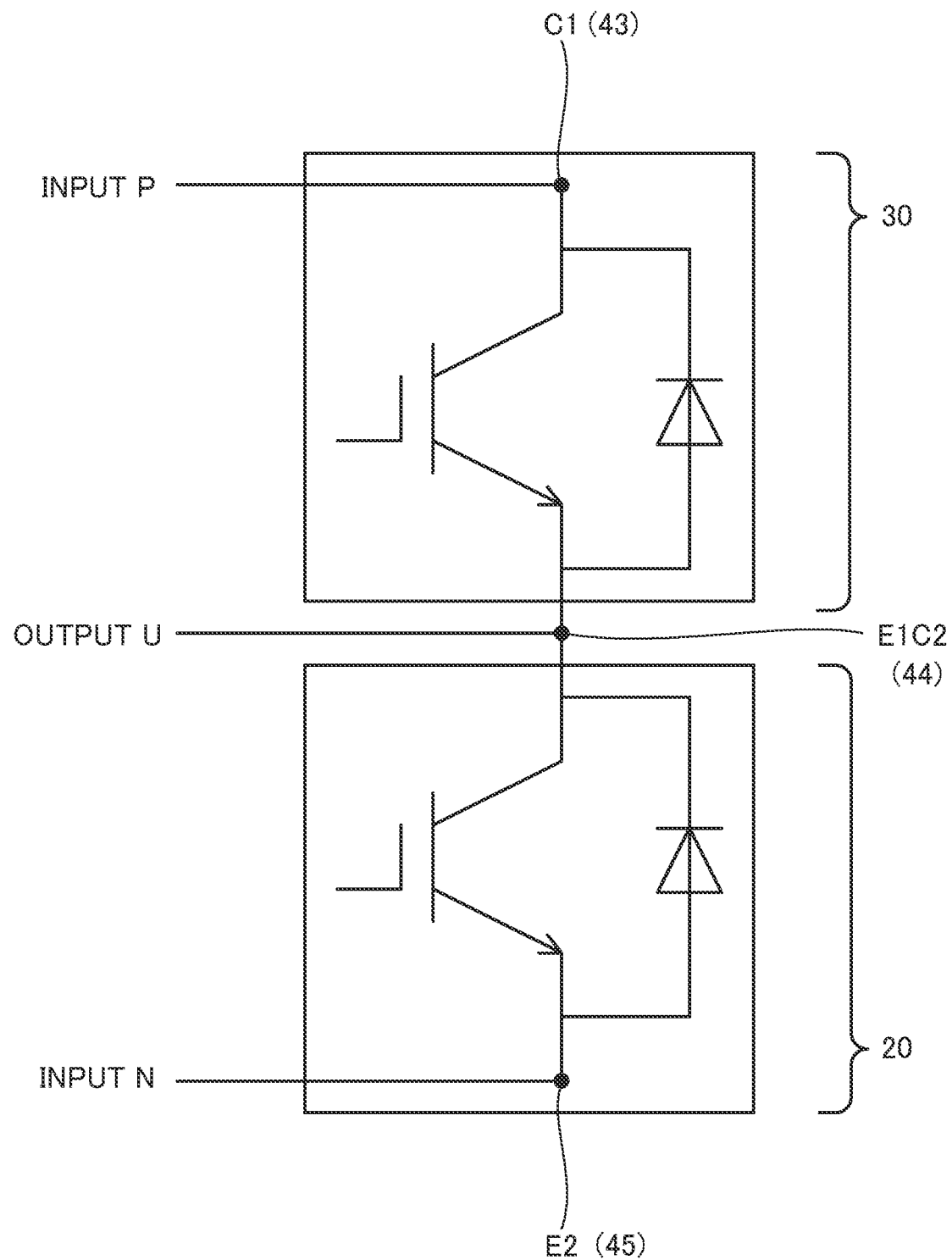
FIG. 4 illustrates circuit structure realized by the semiconductor device according to the second embodiment.

Circuit structure realized by the above semiconductor device 10 will now be described by the use of FIG. 4. FIG. 4 illustrates circuit structure realized by the semiconductor device according to the second embodiment. An inverter circuit illustrated in FIG. 4 is realized by the semiconductor device 10 including the semiconductor chips 25, 26, 35, and 36, the circuit patterns 23a through 23d and 33a through 33e, and the bonding wires 27a through 27j and 37a through 37i.

The semiconductor device 10 has a C1 terminal (corresponding to the external terminal portion 43), an E2 terminal (corresponding to the external terminal portion 45), and an E1C2 terminal (corresponding to the external terminal portion 44). Furthermore, a high potential terminal of an external power supply is connected to the C1 terminal which is an input P terminal, and a low potential terminal of the external power supply is connected to the E2 terminal which is an input N terminal. In addition, a load (not illustrated) is connected to the E1C2 terminal which is an output U terminal of the semiconductor device 10. By doing so, the semiconductor device 10 functions as an inverter.

With the semiconductor device 10 having the above structure, for example, external connection terminals (not illustrated) may be bonded to the external terminal portions 43 through 45 and the first arm block 20 and the second arm block 30 housed in the storage area 42 of the enclosure 41 may be sealed with a sealing member. In this case, a thermosetting resin, such as epoxy resin, phenolic resin, or maleimide resin, may be used as the sealing member.

Figure 5:
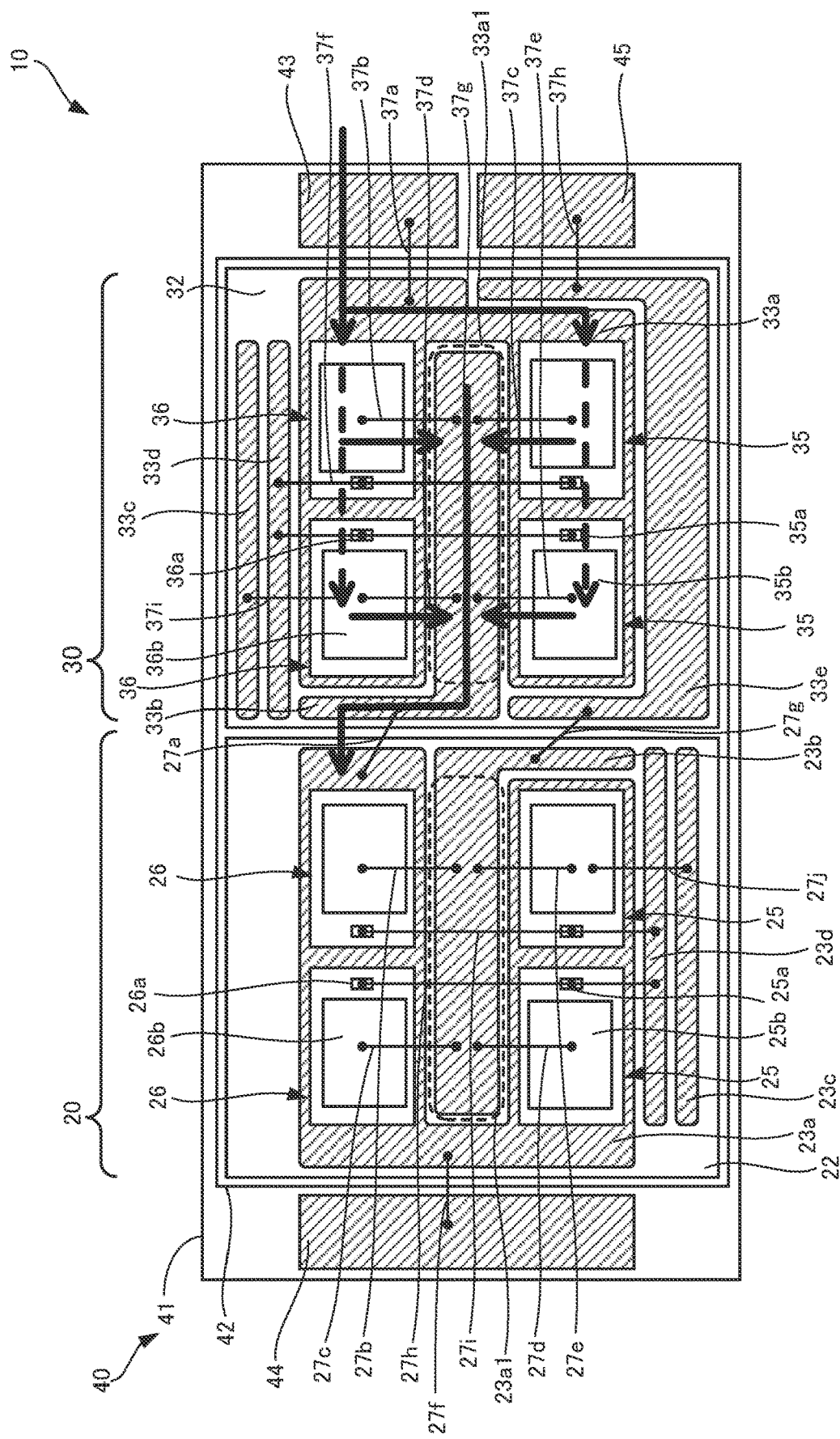
FIG. 5 is a view for describing the flow of a current in the semiconductor device according to the second embodiment.

A case where a current is inputted to operate the semiconductor device 10 will now be described by the use of FIG. 5. FIG. 5 is a view for describing the flow of a current in the semiconductor device according to the second embodiment. A semiconductor device illustrated in FIG. 5 corresponds to the case of FIG. 2A and is that illustrated in FIG. 4. In FIG. 5, however, the flow of a current in the semiconductor device 10 is indicated by a thick line arrow. A dashed arrow indicates the flow of a current in areas of the circuit pattern 33a over which the semiconductor chips 35 and 36 are disposed.

With the semiconductor device 10 a current inputted from the external terminal portion 43 flows via the bonding wire 37a into the circuit pattern 33a. The current flowing into the circuit pattern 33a branches off along the shape of the circuit pattern 33a and flows to the two areas over which the semiconductor chips 35 and 36 are disposed.

Currents after the branching in the circuit pattern 33a in two directions flow into the semiconductor chips 35 and 36 from the collector electrodes on the back surfaces of the semiconductor chips 35 and 36 and output currents are outputted from the emitter electrodes 35b and 36b on the front surfaces of the semiconductor chips 35 and 36. It is assumed that at this time gate voltages are applied to the gate electrodes 35a and 36a of the semiconductor chips 35 and 36 at determined timing. The output currents outputted from the emitter electrodes 35b and 36b of the semiconductor chips 35 and 36 flow into the circuit pattern 33b via the bonding wires 37b, 37c, 37d, and 37e. The output currents flowing in this way into the circuit pattern 33b flow through the circuit pattern 33b and flow into the circuit pattern 23a of the first arm block 20 via the bonding wire 27a.

In the second arm block 30 in which a current flows in this way, the semiconductor chips 35 and 36 are disposed over peripheral portions of the circuit pattern 33a which is U-shaped in plan view. Accordingly, even if the semiconductor chips 35 and 36 generate heat at the time of driving by energization, the heat is dispersed in the second arm block 30 and is not concentrated at one portion. In particular, the semiconductor chips 35 and 36 are RC-IGBTs which are equal in chip size. As a result, the shape of the circuit pattern 33a, which is U-shaped in plan view, is not intricate. That is to say, the circuit pattern 33a is realized by a simple shape. Because the circuit pattern 33a has such a shape, it is possible to easily dispose the semiconductor chips 35 and 36, while saving space. Furthermore, the output currents are outputted from the emitter electrodes 35b and 36b of the semiconductor chips 35 and 36 are collected on the circuit pattern 33b disposed in the central portion. This suppresses imbalance between gate voltages applied to the gate electrodes 35a and 36a of the semiconductor chips 35 and 36 respectively. In addition, the semiconductor chips 35 and 36 are driven in a well-balanced way. Moreover, the wiring length from the external terminal portion 43 to the semiconductor chip 35 is equal to the wiring length from the external terminal portion 43 to the semiconductor chip 36. This suppresses inequality in current between the semiconductor chips 35 and 36.

Furthermore, with the first arm block 20, a current flowing into the circuit pattern 23a flow into the semiconductor chips 25 and 26 from the collector electrodes on the back surfaces of the semiconductor chips 25 and 26 and output currents are outputted from the emitter electrodes 25b and 26b on the front surfaces of the semiconductor chips 25 and 26. This is the same with the second arm block 30. It is assumed that at this time gate voltages are also applied to the gate electrodes 25a and 26a of the semiconductor chips 25 and 26 at determined timing. The output currents outputted from the emitter electrodes 25b and 26b of the semiconductor chips 25 and 26 flow into the circuit pattern 23b via the bonding wires 27b, 27c, 27d, and 27e. The output currents flowing in this way into the circuit pattern 23b flow through the circuit pattern 23b and flow into the circuit pattern 33e of the second arm block 30 via the bonding wire 27g. Accordingly, the same effect that is obtained in the above second arm block 30 is achieved in the first arm block 20.

Figure 6:
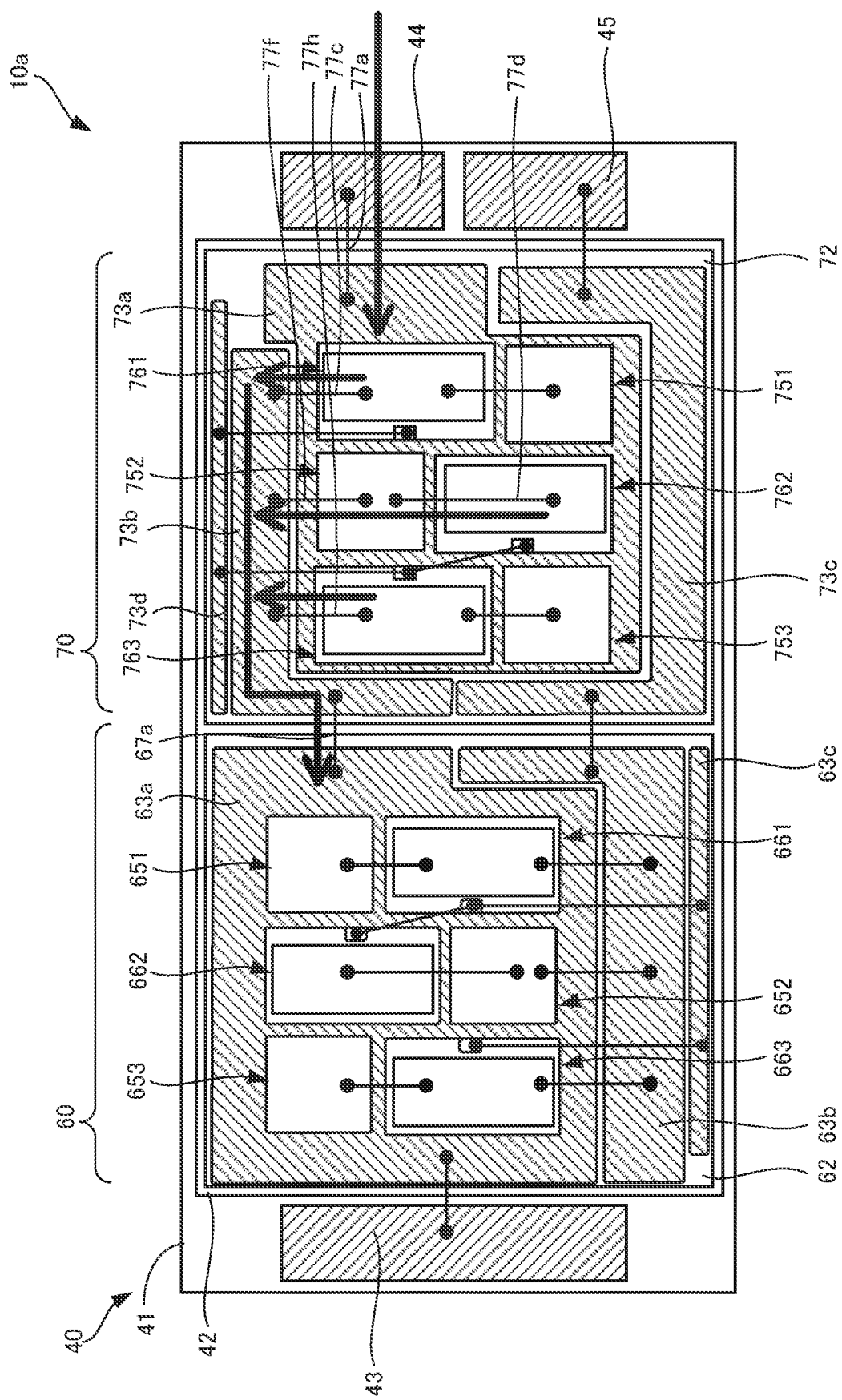
FIG. 6 is a view for describing a semiconductor device taken for reference and the flow of a current in the semiconductor device.

A semiconductor device other than the semiconductor device 10 taken for reference will now be described by the use of FIG. 6. FIG. 6 is a view for describing a semiconductor device taken for reference and the flow of a current in the semiconductor device. Components of a semiconductor device 10a illustrated in FIG. 6 which are the same as those of the semiconductor device 10 are marked with the same numerals. Furthermore, only components which need for description are marked with numerals.

A semiconductor device 10a includes a first arm block 60 and a second arm block 70. With the semiconductor device 10a an upper arm block and a lower arm block are formed of the first arm block 60 and the second arm block 70. The first arm block 60 and the second arm block 70 are electrically connected by a bonding wire 67a and the like. Furthermore, the semiconductor device 10a includes a radiation board (not illustrated) and a case 40. The first arm block 60 and the second arm block 70 are disposed over the radiation board with solder (not illustrated) therebetween. The case 40 is disposed over the radiation board and encloses the first arm block 60 and the second arm block 70. Furthermore, the case 40 and the first arm block 60 and the second arm block 70 are electrically connected by a bonding wire 77a and the like.

The first arm block 60 includes a ceramic circuit board and semiconductor chips 651 through 653 and 661 through 663 located over the front surface of the ceramic circuit board. Furthermore, the ceramic circuit board is disposed over the radiation board with solder, silver solder, or the like (not illustrated) therebetween. The semiconductor chips 651 through 653 are FWDs or SBDs made of silicon or silicon carbide. For example, each of the semiconductor chips 651 through 653 has a cathode electrode (negative electrode) as a main electrode on the back surface and has an anode electrode (positive electrode) as a main electrode on the front surface. In addition, the semiconductor chips 661 through 663 are IGBTs made of silicon. Each of the semiconductor chips 661 through 663 has a collector electrode (positive electrode) on the back surface and has a gate electrode in the center of an edge portion of the front surface and an emitter electrode (negative electrode) in a central portion of the front surface.

The ceramic circuit board includes an insulating board 62 and a metal plate formed on the back surface of the insulating board 62. Furthermore, the ceramic circuit board includes circuit patterns 63a through 63c formed over the front surface of the insulating board 62. Each of the circuit patterns 63a through 63c has a shape illustrated in FIG. 6 and is disposed. In addition, the semiconductor chips 651 through 653 and 661 through 663 are disposed over a central portion of the circuit pattern 63a described later.

The second arm block 70 includes a ceramic circuit board 71 and semiconductor chips 751 through 753 and 761 through 763 located over the front surface of the ceramic circuit board 71. Furthermore, the ceramic circuit board 71 is disposed over the radiation board with solder, silver solder, or the like (not illustrated) therebetween.

The semiconductor chips 751 through 753 and 761 through 763 are made of silicon or silicon carbide. This is the same with the semiconductor chips 751 through 753 and 761 through 763. The semiconductor chips 651 through 653 and 661 through 663 are also FWDs and IGBTs. Accordingly, for example, each of the semiconductor chips 751 through 753 has a cathode electrode (negative electrode) as a main electrode on the back surface and has an anode electrode (positive electrode) as a main electrode on the front surface. Furthermore, each of the semiconductor chips 761 through 763 has a collector electrode (positive electrode) on the back surface and has a gate electrode in the center of an edge portion of the front surface and an emitter electrode (negative electrode) in a central portion of the front surface. In addition, the semiconductor chips 751 through 753 and 761 through 763 are disposed over a central portion of the circuit pattern 73a described later.

The ceramic circuit board 71 includes an insulating board 72 and a metal plate formed on the back surface of the insulating board 72. Furthermore, the ceramic circuit board 71 includes circuit patterns 73a through 73d formed over the front surface of the insulating board 72. Each of the circuit patterns 73a through 73d has a shape illustrated in FIG. 6 and is disposed.

A case where a current is inputted to operate the semiconductor device 10a having the above structure will be described. In FIG. 6, the flow of a current in the semiconductor device 10a is indicated by a thick line arrow. An arrow indicates the flow of a current in areas of the circuit pattern 73a over which the semiconductor chips 751 through 753 and 761 through 763 are disposed.

With the semiconductor device 10a a current inputted from an external terminal portion 44 flows via the bonding wire 77a into the circuit pattern 73a. The current flowing into the circuit pattern 73a spreads through the circuit pattern 73a. The current which spreads through the circuit pattern 73a flows into the semiconductor chips 761 through 763 from the collector electrodes on the back surfaces of the semiconductor chips 761 through 763 and output currents are outputted from the emitter electrodes on the front surfaces of the semiconductor chips 761 through 763. It is assumed that at this time gate voltages are applied to the gate electrodes of the semiconductor chips 761 through 763 at determined timing.

The output currents outputted from the emitter electrodes of the semiconductor chips 761 and 763 are flow via bonding wires 77c and 77h, respectively, into the circuit pattern 73b. The output current outputted from the emitter electrode of the semiconductor chip 762 flows via a bonding wire 77d, the semiconductor chip 752, and a bonding wire 77f into the circuit pattern 73b. The output currents flowing in this way into the circuit pattern 73b flow through the circuit pattern 73b and flow via the bonding wire 67a into the circuit pattern 63a of the first arm block 60.

In the second arm block 70 in which a current flows in this way, the semiconductor chips 751 through 753 and 761 through 763 are disposed over a central portion of the circuit pattern 73a. In particular, the semiconductor chips 751 through 753 and 761 through 763 differ in type and chip size. As a result, there is need to secure many areas on the circuit pattern 73a for disposing the semiconductor chips 751 through 753 and 761 through 763. Furthermore, when the semiconductor chips 751 through 753 and 761 through 763 are disposed over the circuit pattern 73a, there is need to dispose them in zigzag over the central portion of the circuit pattern 73a. Accordingly, if the semiconductor chips 761 through 763 generate heat at the time of driving by energization, then the heat is concentrated in a central portion of the second arm block 70. In addition, there is inequality in wiring length to the circuit pattern 73b among the output currents outputted from the emitter electrodes of the semiconductor chips 761 and 763. This leads to an imbalance among gate voltages applied to the gate electrodes of the semiconductor chips 761 through 763. Accordingly, it is difficult to drive the semiconductor chips 761 through 763 in a well-balanced way. A concrete description of the first arm block 60 into which a current flows from the second arm block 70 will be omitted. However, the current flows in the same way as with the second arm block 70 and the same problem as with the second arm block 70 exists.

As has been described, the first arm block 20 and second arm block 30 included in the above semiconductor device 10 include the semiconductor chips 25 and 26 and the semiconductor chips 35 and 36 respectively. The semiconductor chips 25, 26, 35, and 36 have the collector electrodes on the back surfaces and have the emitter electrodes 25b, 26b, 35b, and 36b and the gate electrodes 25a, 26a, 35a, and 36a, respectively, on the front surfaces. Furthermore, the first arm block 20 and second arm block 30 include the circuit patterns 23a and 33a respectively. The circuit patterns 23a and 33a are U-shaped in plan view and surround at least parts of the disposition areas 23a1 and 33a1 respectively. The back surfaces of the semiconductor chips 25 and 26 and the semiconductor chips 35 and 36 are disposed over the circuit patterns 23a and 33a respectively. In addition, the first arm block 20 and second arm block 30 include the circuit patterns 23b and 33b respectively. The circuit patterns 23b and 33b are disposed in the disposition areas 23a1 and 33a1 respectively. At least parts of the circuit patterns 23b and 33b are surrounded by the circuit patterns 23a and 33a respectively. The circuit patterns 23b and 33b are electrically connected to the emitter electrodes 25b and 26b of the semiconductor chips 25 and 26 and the emitter electrodes 35b and 36b of the semiconductor chips 35 and 36 by the bonding wires 27b, 27c, 27d, and 27e and the bonding wires 37b, 37c, 37d, and 37e respectively. As a result, the semiconductor chips 25 and 26 and the semiconductor chips 35 and 36 disposed over the circuit patterns 23a and 33a are not disposed in block over the central portions of the ceramic circuit boards 21 and 31 respectively. The semiconductor chips 25 and 26 and the semiconductor chips 35 and 36 are situated over the outer peripheral portions of the ceramic circuit boards 21 and 31 respectively. Accordingly, heat in the ceramic circuit boards 21 and 31 is dispersed and the heat dissipation property is improved. In addition, emitter currents outputted from the semiconductor chips 25 and 26 and the semiconductor chips 35 and 36 are collected on the circuit patterns 23b and 33b disposed in the central portions of the ceramic circuit boards 21 and 31 respectively. As a result, gate voltages applied to gate electrodes 25a, 26a, 35a, and 36a of the semiconductor chips 25, 26, 35, and 36 become equal and the semiconductor chips 25, 26, 35, and 36 are driven in a well-balanced way. This suppresses deterioration in the characteristics of the semiconductor device 10 including the first arm block 20 and second arm block 30.

According to the disclosed technique, heat concentration is prevented and the characteristics of the semiconductor device are improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
a first arm block including:
   a first circuit pattern that, in a plan view of the semiconductor device, has a first recess formed thereon that extends inward in a first direction from a side thereof, the first recess forming a first disposition area;
   a second circuit pattern having at least a part disposed in the first disposition area; and
   a plurality of first semiconductor chips formed on the first circuit pattern, each first semiconductor chip having
      a first positive electrode on a back surface thereof, and
      a first control electrode and a first negative electrode on a front surface thereof, the first negative electrode being electrically connected to the second circuit pattern by a first wiring member; and
a second arm block including:
   a third circuit pattern that, in the plan view, has a second recess formed thereon that extends inward in a second direction from a side thereof, the second direction being opposite to the first direction, the second recess forming a second disposition area;
   a fourth circuit pattern having at least a part disposed in the second disposition area; and
   a plurality of second semiconductor chips formed on the third circuit pattern, each second semiconductor chip having
      a second positive electrode on a back surface thereof, and
      a second control electrode and a second negative electrode on a front surface thereof, the second negative electrode being electrically connected to the fourth circuit pattern by a second wiring member.

2. The semiconductor device according to claim 1, wherein each of the first semiconductor chips is a reverse-conducting insulated gate bipolar transistor (RC-IGBT).

3. The semiconductor device according to claim 1, wherein each of the first semiconductor chips is a metal oxide semiconductor field effect transistor (MOSFET) with a built-in body diode.

4. The semiconductor device according to claim 1, wherein
   two of the plurality of first semiconductor chips are disposed on opposite sides of the first disposition area in the plan view, the two first control electrodes of said two first semiconductor chips being aligned in a second direction perpendicular to the first direction.

5. The semiconductor device according to claim 1, wherein
the first circuit pattern has an area on which one of the first semiconductor chips is disposed,
the first arm block further includes a fifth circuit pattern adjacent to the area of the first circuit pattern, to sandwich the area of the first circuit pattern between the fifth circuit pattern and the first disposition area, the fifth circuit pattern being electrically connected to the first control electrode of said first semiconductor chip by a first control wiring member, and
the one of the first semiconductor chip and the first disposition area are arranged side by side in a direction perpendicular to the first direction.

6. The semiconductor device according to claim 1, wherein the first arm block further includes:
an input area on the first circuit pattern,
an output area on the second circuit pattern, the input area and the output area being on opposite sides of the first arm block in the first direction,
an input wiring member connected to the input area on the first circuit pattern, and
an output wiring member connected to the output area on the second circuit pattern.

7. The semiconductor device according to claim 1, wherein the second circuit pattern has a shape of a letter "L" in the plan view, and includes a first portion disposed in the first disposition area and a second portion extending in a third direction perpendicular to the first direction.

8. The semiconductor device according to claim 1, wherein the second circuit pattern has a shape of a letter "T" in the plan view, and includes a first portion disposed in the first disposition area and a second portion extending in a third direction perpendicular to the first direction.

9. The semiconductor device according to claim 1, wherein the fourth circuit pattern has a shape of a letter "T" in the plan view, and includes a third portion disposed in the second disposition area and a fourth portion extending in a fourth direction perpendicular to the second direction.

10. The semiconductor device according to claim 1, wherein:
the first circuit pattern has an area on which one of the first semiconductor chips is disposed;
the third circuit pattern has an area on which one of the second semiconductor chips is disposed;
the first arm block further includes a fifth circuit pattern adjacent to the area of the first circuit pattern, to sandwich the area of the first circuit pattern between the fifth circuit pattern and the first disposition area, the fifth circuit pattern being electrically connected to the first control electrode of said first semiconductor chip by a first control wiring member; and
the second arm block further includes a sixth circuit pattern adjacent to the area of the third circuit pattern, to sandwich the area of the third circuit pattern between the sixth circuit pattern and the second disposition area, the sixth circuit pattern being electrically connected to the second control electrode of said second semiconductor chip by a second control wiring member, the fifth and sixth circuit pattern being disposed on opposite sides of the semiconductor device, with the first disposition area and the second disposition area therebetween.

11. The semiconductor device according to claim 5, wherein:
the first control wiring member is wired from the first control electrode of said first semiconductor chip in a second direction perpendicular to the first direction; and
the first wiring member is wired from the first negative electrode of said first semiconductor chip to the second circuit pattern in parallel to the first control wiring member.

12. The semiconductor device according to claim 7, wherein the fourth circuit pattern has the shape of the letter "L" in the plan view, and includes a third portion disposed in the second disposition area and a fourth portion extending in a fourth direction perpendicular to the second direction, the fourth direction being opposite to the third direction.

13. The semiconductor device according to claim 10, wherein:
in the first arm block:
the first control wiring member is wired from the first control electrode of said first semiconductor chip in a third direction perpendicular to the first direction, and
the first wiring member is wired from the first negative electrode of said first semiconductor chip to the second circuit pattern in parallel to the first control wiring member; and
in the second arm block:
the second control wiring member is wired from the second control electrode of said second semiconductor chip in a fourth direction perpendicular to the second direction, the first and second control wiring members being respectively on the opposite sides of the semiconductor device; and
the second wiring member is wired from the second positive electrode of said second semiconductor chip to the fourth circuit pattern in parallel to the second control wiring member.

14. The semiconductor device according to claim 13, wherein:
the first arm block further includes:
a first input area on the first circuit pattern,
a first output area on the second circuit pattern, the first input area and the first output area being opposite to each other in the first direction,
a first input wiring member connected to the first input area on the first circuit pattern, and
a first output wiring member connected to the first output area on the second circuit pattern; and
the second arm block further includes:
a second input area on the third circuit pattern,
a second output area on the fourth circuit pattern, the second input area and the second output area being opposite to each other in the second direction,
a second input wiring member connected to the second input area on the third circuit pattern; and
a second output wiring member connected to the second output area of the fourth circuit pattern.

* * * * *